US008653993B2

(12) United States Patent
Bendel et al.

(10) Patent No.: US 8,653,993 B2
(45) Date of Patent: Feb. 18, 2014

(54) DATA VALUE OCCURRENCE INFORMATION FOR DATA COMPRESSION

(75) Inventors: Peter Bendel, Holzgerlingen (DE); Oliver Draese, Holzgerlingen (DE); Namik Hrle, Boeblingen (DE); Tianchao Li, Boeblingen (DE)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/515,043

(22) PCT Filed: Dec. 7, 2010

(86) PCT No.: PCT/EP2010/069086
§ 371 (c)(1),
(2), (4) Date: Jun. 11, 2012

(87) PCT Pub. No.: WO2011/080030
PCT Pub. Date: Jul. 7, 2011

(65) Prior Publication Data
US 2013/0033389 A1     Feb. 7, 2013

(30) Foreign Application Priority Data
Dec. 29, 2009  (EP) ..................................... 09180917

(51) Int. Cl.
*H03M 7/40*        (2006.01)
(52) U.S. Cl.
USPC ................................. 341/67; 341/50; 341/51
(58) Field of Classification Search
USPC ............................................. 341/50, 51, 67
See application file for complete search history.

(56) References Cited

U.S. PATENT DOCUMENTS

| 7,339,501 B2* | 3/2008 | Ban et al. .......................... 341/51 |
| 7,827,187 B2 | 11/2010 | Raman et al. |
| 2005/0007947 A1* | 1/2005 | Abe et al. ...................... 370/206 |

(Continued)

FOREIGN PATENT DOCUMENTS

WO     2011080031 A1     7/2011

OTHER PUBLICATIONS

Anonymous: Delta Encoding, Widipedia Article from Nov. 26, 2009; internet article, Nov. 26, 2009, XP002642806; Retrieved from the Internet: URL:http://en.wikipedia.org/w/index.php?title=Delta_encoding&oldid=328001426 [retrieved on Jun. 17, 2011] ; 4 pages.

(Continued)

*Primary Examiner* — Jean B Jeanglaude
(74) *Attorney, Agent, or Firm* — Cantor Colburn LLP; Elissa Wang

(57) ABSTRACT

A method for generating occurrence data of data values for enabling encoding of a data set includes determining occurrences of data values in a first data batch and determining occurrence count information for a first number of most frequent data values in the first data batch, the occurrence count information identifying the most frequent data values and their occurrence counts. The method also includes generating for rest of the data values in the first data batch at least a first histogram having a second number of buckets and merging the occurrence count information of the first data batch with occurrence count information of a second data batch. The method further includes merging the first histogram of the first data batch to a merged histogram corresponding to the second data batch and processing a next data batch as a first data batch until the data set to be encoded is processed.

20 Claims, 5 Drawing Sheets

(56) References Cited

U.S. PATENT DOCUMENTS

2007/0186142 A1* 8/2007 Okazaki et al. ............... 714/774
2008/0288953 A1* 11/2008 Ando et al. .................... 718/106
2009/0174583 A1 7/2009 Diaz-Gutierrez et al.
2009/0254521 A1 10/2009 Raman et al.

OTHER PUBLICATIONS

Berger et al., "Index Compression with DB2 9 for z/OS", Feb. 28, 2008; XP002642099; Retrieved from the Internet: URL:http://www.redbooks.ibm.com/redpapers/pdfs/redp4345.pdf [retrieved on Jun. 15, 2011]; 18 pages.

Bhattacharjee et al., "IBM Research Report Efficient Index Compression in DB2 LUW", Jul. 1, 2009, XP002642166; retrieved from the Inernet: URL:http://www.cs.uni-paderborn.de/fileadmin/Informatik/AG-Boettcher/Lehre/WS_09_10/pro-sem-ws09/Efficient_Index_Compression_in_DB2-LUW.pdf; [retrieved on Jun. 15, 2011], 13 pages.

International Search Report for Application No. DE920090063; PCT/EP2010/069086; International Filing Date: Dec. 7, 2010; Date of Mailing: Jun. 30, 2011; 10 pages.

Morris, Mark "Teradata-Multi-Value Compression" Internet article, Jul. 2007, XP002642068; Retrieved from the Internet: URL:http://www.teradata.com/assets/0/206/280/60flb5ff-d128-4985-9cac-f30ac37b9bed.pdff [retrieved on Jun. 15, 2011]; 12 pages.

English Abstract:"Histogramm"; In: Online-Bibliothek Wikipedia; http://de.wikipedia.org/w/index.ph;?title=Histogramm&oldid=68372140 , zuletzt geandert am Dec. 23, 2009; 1 page.

German Office Action dated Jan. 10, 2013; Application No. DE112010004531T filed Dec. 7, 2010; 7 pages.

"Histogramm"; In: Online-Bibliothek Wikipedia; http://de.wikipedia.org/w/index.ph;?title=Histogramm&oldid=68372140 , zuletzt geandert am Dec. 23, 2009; 6 pages.

* cited by examiner

| Value | Count of occurrences | Probability | Compression Code |
|---|---|---|---|
| Apple | 4 | 4/10 | 1 |
| Banana | 3 | 3/10 | 00 |
| Orange | 2 | 2/10 | 010 |
| Peach | 1 | 1/10 | 011 |

DATA VALUE OCCURRENCE INFORMATION FOR DATA COMPRESSION

PRIORITY

This is a U.S. national stage of application No. PCT/EP2010/069086, filed on Dec. 7, 2010. Priority under 35 U.S.C. §119(a) and 35 U.S.C. §365(b) is claimed from European Patent Application No. 09180917.8, filed Dec. 29, 2009, and all the benefits accruing therefrom under 35 U.S.C. §119, the contents of which in its entirety are herein incorporated by reference.

BACKGROUND

The present invention relates in general to data compression and data encoding. In particular, the present invention relates to generating occurrence information for data values in a data set to be encoded or compressed.

Data compression is an important aspect of various computing and storage systems. While data warehouses are discussed in some detail as an example of systems where data compression is relevant, it is appreciated that data compression and efficient handling of compressed data is relevant in many other systems where large amounts of data are stored. In general, data warehouses are repositories of an organization's electronically stored data, which are designed to facilitate reporting and analysis.

The effectiveness of data warehouses that employ table scans for fast processing of queries relies on efficient compression of the data. With adequate data compression method, table scans can be directly applied on the compressed data, instead of having to decode each value first. Also, well designed algorithms can scan over multiple compressed values that are packed into one word size in each loop. Therefore, shorter code typically means faster table scan. The following compression methods are well-known. Dictionary based compression encodes a value from a large value space but relatively much smaller set of actual values (cardinality) with a dictionary code. Offset based compression compresses data by subtracting a common base value from each of the original values and uses the remaining offset to represent the original value. The prefix-offset compression encodes a value by splitting its binary representation into prefix bits and offset bits, and concatenates the dictionary code of the prefix bits with the offset bits as the encoding code.

One of the most important criteria for compression efficiency is the average code length, which is the total size of compressed data divided by the number of values in it. One way of achieving better compression efficiency, i.e. smaller average code length, is to encode the values with a higher probability with a shorter code.

SUMMARY

According to an exemplary embodiment, a computerized method for generating occurrence data of data values for enabling encoding of a data set, the method includes determining occurrences of data values in a first data batch and determining occurrence count information for at most a first number of most frequent data values in the first data batch, the occurrence count information identifying the most frequent data values and their occurrence counts. The method also includes generating for rest of the data values in the first data batch at least a first histogram having a second number of buckets and merging the occurrence count information of the first data batch to merged occurrence count information of a second data batch. The method further includes merging the first histogram of the first data batch to a merged histogram corresponding to the second data batch and processing a next data batch as a first data batch until the data set to be encoded is processed in batches.

According to another exemplary embodiment, a data processing system includes input means for receiving data to be encoded and splitting means for splitting data to be encoded into data batches. The system also includes batch histogram means for determining occurrences of data values in a data batch, the batch histogram means is adapted to determine occurrence count information for at most a first number of most frequent data values in the data batch. The occurrence count information identifies the most frequent data values and their occurrence counts. The batch histogram means is also adapted to generate for rest of the data values in the data batch at least a first histogram having a second number of buckets. The system also includes merging means, operably connected to the batch histogram means, for merging the occurrence count information of a first data batch to merged occurrence count information of at least one further data batch and for merging the first histogram of a first data batch to a merged histogram corresponding to the at least one further data batch.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

For a better understanding of the present invention and as how the same may be carried into effect, reference will now be made by way of example only to the accompanying drawings in which.

DETAILED DESCRIPTION

Several encoding techniques exist for dictionary based compression that assigns shorter code for values with a higher probability. The well-known Huffman coding uses a variable length prefix code. The frequency partitioning method, described in the US patent application 20090254521A1, partitions values according to their occurrence probability and assigns fixed length dictionary code to values of each partition, with partitions containing more frequent values having a shorter code length.

Figures 1, 2:
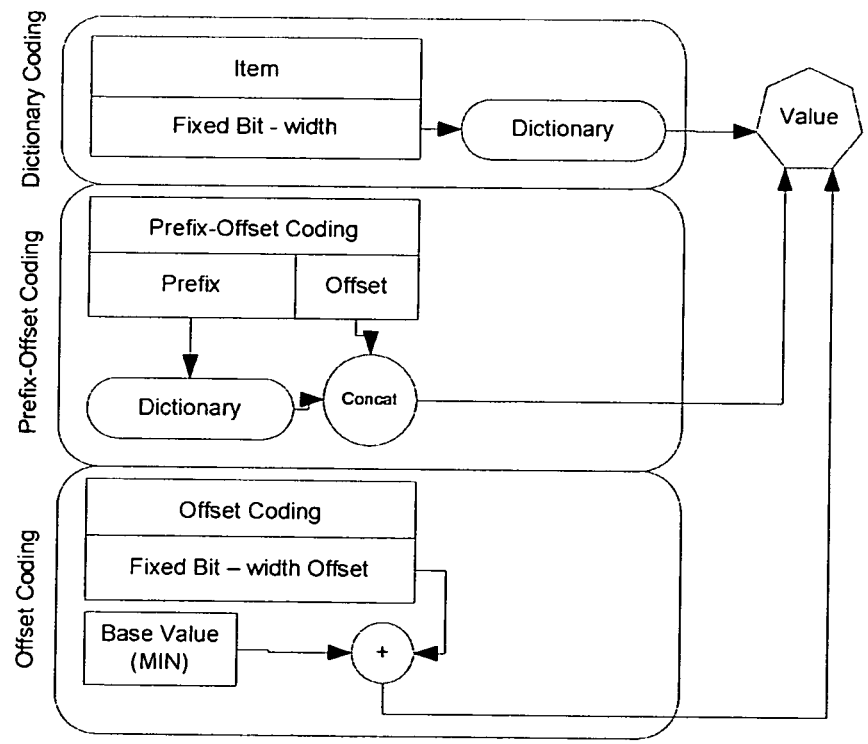
FIG. 1 shows, as a table, an example of occurrence counting and dictionary compression using Hoffmann coding.
FIG. 2 shows schematically, as an example, a hybrid data compression method that can be used together with an embodiment of the invention.

An example using the well-known Huffman code is shown in a table in FIG. 1; the data set to be compressed in this example is the following {apple, apple, orange, banana, orange, banana, apple, peach, banana, apple}. The table illustrates how the occurrences of each distinct value are counted first to calculate the probability, and then the compression codes are assigned. This is feasible only if the amount of distinct values is limited, so that a complete list of value/count pairs can be established within the memory of the computer system. However, this is not the case when the cardinality of values is very big—for example, 64 bit integer has 264 (~1.8E19) possible values.

For prefix-offset compression, when prefix bits are encoded in the dictionary, such probability dependent encoding techniques can also be applied to improve the encoding efficiency. It is also known that decreasing the length of offset bits can be beneficial to the compression efficiency, but it has an upper bound set by the memory (because each distinct prefix code needs to be maintained within a dictionary) and there are usually always some bits wasted in the offset part because specific combinations are never used. In fact, if unlimited memory can be used, the prefix-offset compression is always less efficient than pure dictionary based compression, which can be considered as an extreme case of prefix-offset compression that uses a maximum number of prefix bits and zero offset bits.

Offset based compression does not consider value probabilities at all. Although it is also never more efficient than pure dictionary based compression, its encoding efficiency can be better or worse than prefix-offset compression, depending on the nature of the original value the same common base value can be applied to all values in the original data to derive offsets that can be efficiently stored. In addition, its applicability is limited to certain data types only, because of its implicit requirement on numerical stability.

It is therefore desirable to use a hybrid of above mentioned different data compression method to get the best compression under certain memory constraints. FIG. 2 illustrates such a hybrid compression method, where dictionary based compression may be applied for the most frequent values (upmost portion of FIG. 2), and prefix-offset compression may be applied for less frequent values (middle portion of FIG. 2), and for the remaining values offset based compression may be applied when appropriate (bottom portion of FIG. 2). The infrequent values may alternatively be left uncompressed, when offset based compression is not applicable or not beneficial. By limiting the size of the two dictionaries that are involved one for the dictionary based compression and one for the prefix-offset compression the memory usage can still be controlled.

To be able to determine, which data compression method to use for which values in a data set, frequencies of all distinct values is the data set should be determined, which may be challenging for big data sets that may contain terabytes of data and contain millions of distinct values. The available memory may not be sufficient for storing the occurrence information, and in many cases it is not feasible to use disk space for storing the occurrence information. The major difficulty of applying such hybrid compression methods is thus how to partition the data into most frequent values, less frequent values, and infrequent values without being able to construct a complete table of occurrences of each individual values.

Furthermore, in cases where order-preserving encoding is used to support efficient query processing using scanning on compressed data, the need for frequencies of all distinct values becomes even more important. One needs to make sure that each individual value is correctly positioned in the dictionary. Sampling will not work since it is always possible to miss part of the values in the sample.

In exemplary embodiments, a method that effectively limits the amount of necessary memory while preserving the most important probability information during the collection of occurrence information of large amounts of data with very large cardinality (i.e. distinct data values) is provided. When such information is available, it is possible to use, for example, the hybrid compression techniques optimally. In exemplary embodiments, the data set is divided into batches of preferably fixed sizes that are compressed. The occurrences of values in each batch are tracked with a multi-granularity histogram, where the most frequent values (items) are tracked individually and rest of the values are tracked using histogram buckets and, optionally, as noise (see FIG. 3 and the relating description below). The multi-granularity histograms of subsequent batches are then merged together.

During the processing of the first data batch, the optimal parameters for the histogram buckets (i.e. the split point between the prefix bits and offset bits of prefix-offset encoding, when prefix-offset encoding is used for the values in the histogram buckets) may be calculated. It is alternatively possible to employ a separate pre-processing step where the data to be encoded is sampled, and determine the parameters for the histogram buckets. The bucket width may later be adjusted during merging of the multi-granularity histograms.

Figure 3:
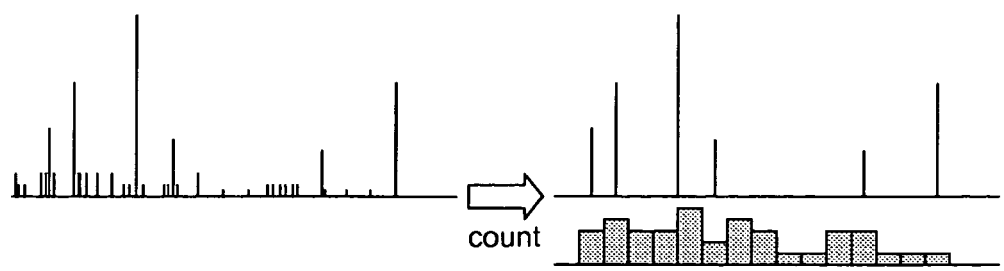
FIG. 3 shows an example of a multi-granularity histogram for use in connection with embodiments of the present invention.

FIG. 3 shows an example of a multi-granularity histogram. A multi-granularity histogram is a data structure that represents the occurrences of values in different granularities. The most frequent values are counted individually as items and the resulting occurrence count information indicates the individual values and their occurrence counts. Less frequent values are counted using histogram buckets, each bucket containing values with the same prefix bits (with all buckets having the same length of offset bits) when assuming that prefix-offset encoding is used for the values in the buckets. For buckets, it is tracked which value range is associated with a bucket and how many occurrences of values in the value range there are. Optionally, the most infrequent values are handled globally as noise. The items, buckets, and noise constitute three different levels of granularity for occurrence counting, from finest to coarsest.

The configuration parameters of a multi-granularity histogram include the following. The maximal number of items (most frequent values) is limited to M and the maximal number of histogram buckets limited to N. Both M and N are predefined parameters; preferably their values are defined as a power of 2. For buckets, the split point between the prefix bits and offset bits is defined by the length of offset bits S, which represents width of bucket. In addition, whether or not the least frequent values are counted as noise, is more or less a preference of the user. Even if the offset based compression is not always applicable, the noisy data can be used in the original uncompressed format. It is possible to avoid any value counted as noise by using a large enough bucket width.

Each item is identified by its value, and information about the item (occurrence count information) contains the value and the occurrence count of that value. With a universal bucket width and prefix-offset encoding used for values in the buckets, each bucket is identified by the prefix bits and contains count of all values with the prefix. For noise, the count of all remaining values, the minimal value and the maximal value are collected when appropriate. FIG. 3 illustrates the counting of occurrences in a multi-granularity histogram in the right-hand panel. The most frequent values (the six highest peaks in histogram in the left-hand side panel of FIG. 3)

are counted as items, and less frequent ones (rest of the peaks in the left-hand side panel of FIG. 3) in buckets in the multi-granularity histogram in the right-hand side panel of FIG. 3.

A multi-granularity histogram preserves enough information so that hybrid compression methods can be applied once all batches of data have been processed and the resulting merged multi-granularity histogram presents the whole data set. The process of constructing a multi-granularity histogram requires some computational effort. Due to memory limitations, it is not possible to construct a complete table of occurrences of each individual values in high volume data of very large cardinality. Without knowing the occurrences of individual values, it is difficult to decide whether it should be counted individually or together with other values of the same prefix.

Any dictionary based compression methods may be applied to the items (i.e. to the M most frequent values) so that the highest compression rate can be possible. Any prefix-offset compression may be applied for values in the buckets and offset based compression may be applied to the values counted as noise (if there are any) when appropriate. Alternatively, as mentioned above, the noise values may be left uncompressed.

Based on the probability of each items and buckets, probability-dependent encoding techniques may be applied for better encoding efficiency. As one example, the frequency partition method for dictionary based compression as explained in the US patent application US20090254521A1 can be applied to the most frequent values. That is, the most frequent values are divided into partitions of ascending sizes with descending frequency of individual values. Each partition is encoded with codes of fixed (also ascending) length.

One example of the prefix-offset encoding that can be used for encoding the values associated with the buckets is the order-preserving prefix-offset encoding described in the patent application "Prefix-offset encoding method" filed at the same date as this application by the same applicant.

It is appreciated that the present multi-granularity histogram technique is very beneficial in connection with the hybrid compression with dictionary encoding for frequent values, prefix-offset coding for buckets, and offset-based encoding or no encoding for the noise values. However, other compression methods may gain from using the multi-granularity histogram technique as well. The concrete definition of buckets can be generalized by replacing the prefix-offset encoding with another alternative that has a concept similar to buckets, meaning coarser granularity. As a naive example, it is possible to have each bucket represent different value ranges (minimal and maximal values, which must be exclusive from each other, and collectively cover the whole range of actual values) for offset encoding, and count values that fall into that range.

Figure 4:
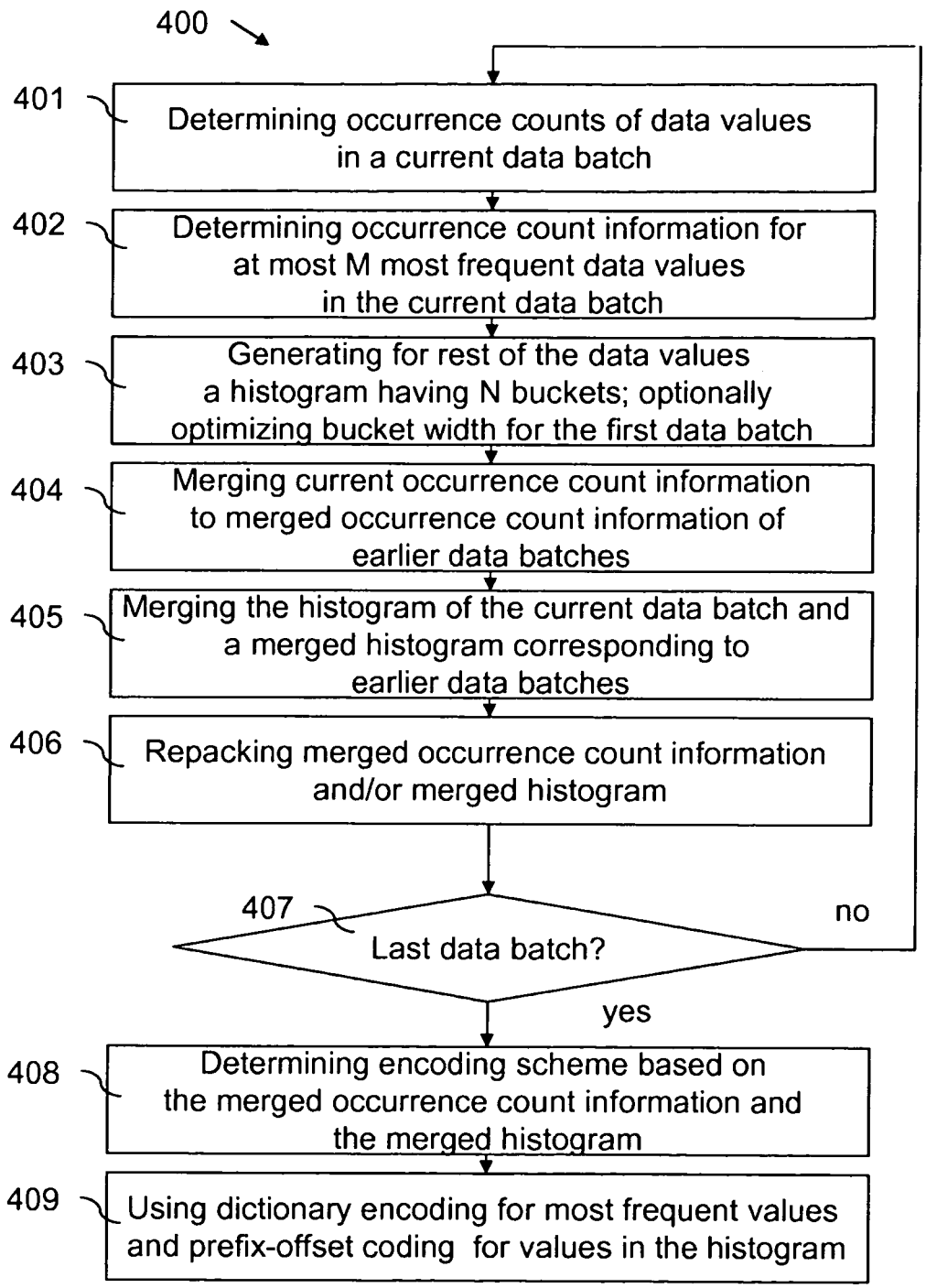
FIG. 4 shows a flowchart of a method in accordance with an embodiment of the present invention.

FIG. 4 shows a flowchart of a method 400 in accordance with an embodiment of the present invention. The method 400 generates occurrence data for enabling encoding or compression of a data set, and it is typically implemented in a computer system. The data set to be compressed (or encoded) is divided into batches, and the batches are processed one after another. The processing can occur, for example, when data is loaded to an in-memory database.

The data to be processed is divided into batches each containing preferably a fixed number of values. The batch size B is chosen so that a full count of the individual values contained in the data batch will not exhaust the memory available for this occurrence information determination task. The size B even needs to be small enough to be able to have two histograms temporarily in memory which are then merged into one, joined histogram in a later operation. Too small size B should also be avoided due to overhead of counting and merging of too many batches. A reasonable size of batch size is also needed (so that there are enough initial value counts) to effectively apply the automatic optimal bucket width calculation algorithm that will be introduced later.

For each data batch, the system determines an individual multi-granularity histogram by the following steps 401-403. In step 401, the computing system determines occurrence counts of data values in the first (current) data batch. In other words, the system builds a temporary histogram of all individual items, i.e. the system counts the occurrences of each individual values in the first (current) data batch. By controlling the size of each data batch, it is possible to ensure that memory is not exhausted. The outcome of step 401 is the information shown in the left-hand side panel of FIG. 3.

In steps 402 and 403, the system determines the multi-granularity histogram for the first (current) data batch. In step 402, the system determines occurrence count information for at most M of most frequent data values in the current data batch. The occurrence count information identifies the most frequent data values and their occurrence counts.

In step 403, the system generates for the rest of the data values in the current data batch a histogram having a second number (N) of buckets. Here, all the less frequent data values (not handled in step 402) may be placed into N buckets. Alternatively, if there would be more than N buckets in the histogram, the N most frequent buckets are kept in the histogram and the remaining data values are handled as noise.

For the first data batch, the optimal bucket width for the multi-granularity histogram may be determined before the buckets are filled. In exemplary embodiments, determining the optimal bucket width may be done by iteratively comparing the entropy of various alternatives, which is described in more details below. Alternatively, a predetermined bucket width may be used in cases where the distribution of the data is known beforehand.

Figure 5:
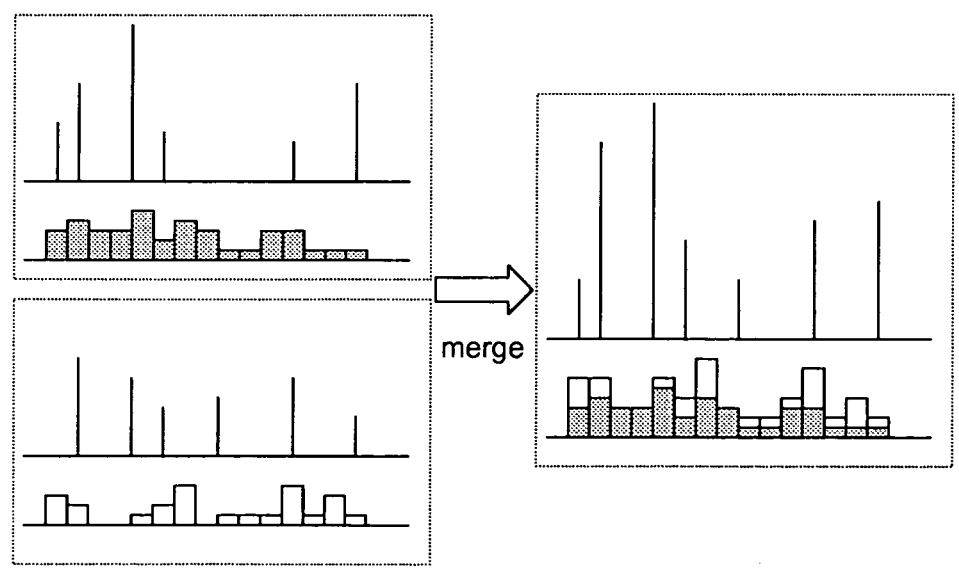
FIG. 5 shows, as an example, merging of two multi-granularity histograms together.

In steps 404 and 405, which are not relevant for the first data batch but for the subsequent data batches, the multi-granularity histogram of the current data batch is merged to the multi-granularity histogram corresponding to the earlier data batches of the data set. FIG. 5 and the associated description below discuss merging in more detail. In step 404, the system merges the occurrence count information of the current data batch (information about at most M most frequent values) with merged occurrence count information of data batches processed earlier (again, information about at most M most frequent values). The merged occurrence count information thus contains, depending on the data distribution in the current batch and in the earlier batches, at least temporarily each of the values indicated in the occurrence count information for the current data batch and for the earlier data batches. If the number of frequent values in the merged occurrence information increases too fast, repacking of the merged multi-granularity histogram may be needed in (optional) step 406 (see more details below).

In step 405, the system merges the histogram of the current data batch to a merged histogram corresponding to data batches processed earlier. Buckets of two multi-granularity histograms are thus merged together. If the data distribution changes from data batch to data batch, it is possible that the number of buckets in the merged histogram becomes larger than N. In that case, the bucket width may be adjusted in optional step 406 (see more details below).

At any time during the process of determining occurrence information, there are only two instances of the multi-granularity histogram, the merged multi-granularity histogram of all previous data batches and the multi-granularity histogram being counted for the current batch.

In step 407, the system checks whether all data batches of the data set have been processed. If there are more data batched to process, the method continues from step 401 and processes a next data batch as a current data batch until the data set to be encoded is processed in batches. After the last data batch has been processed, the system proceeds to step 408 and determines an encoding scheme for the data set based on the merged frequency count information corresponding to the data set and the merged histogram corresponding to the data set. In step 409, the system then encodes the data set using the encoding scheme. Typically, dictionary encoding is used for the most frequent values, prefix-offset coding is used for the values in the buckets, and offset encoding is used for the noises (if available) when applicable.

It is appreciated that the order of steps in all methods according to the invention need not be the one shown in FIG. 4 and some steps may be optional. As an example, the optional repacking step 406 may be left out if it is not needed or repacking may carried out at after the whole data set has been processed.

When prefix-offset encoding is used for values in the buckets, the width of the buckets in a histogram is defined as the number of offset bits in prefix-offset encoding. The influence of the bucket width on the encoding efficiency is two-fold. On the one hand, shorter offset bits, i.e. smaller bucket width, will result into more efficient encoding for the values contained in the buckets, which is a proven property of prefix-offset encoding. On the other hand, smaller bucket width means each bucket can contain less distinct values and require a larger number of buckets, which has an upper-bound N. It might also result into an overflow with the most infrequent values counted as noises.

The optimal bucket width can be automatically detected through an optimization process for the first data batch or by sampling the whole data set to be encoded in a separate pre-processing step. The general target is to minimize the size of prefix-offset code which includes the dictionary code for the prefix bits and the offset bits under the constraint of specified maximal size of dictionary.

The optimal bucket width that results into the best encoding efficiency may be derived by comparing various possible bucket widths. A simplified algorithm can be described as the following:

```
INPUT:
    M := max number of items in the histogram
    N := max number of buckets in the histogram
    V := a set of data values
    Z := size of data in bits
OUTPUT:
    best#OffsetBits := the optimal number of offset bits
ALGORITHM:
1.  best#OffsetBits := 0
2.  bestEncodingSize := Z
3.  FOR #offsetBits FROM Z TO 1
    a.  // a multi-level histogram
        // with M items, N buckets, #offsetBits
        histogram := new Histogram(M, N, #offsetBits)
    a.  histogram.fillValues(V) // build histogram
    b.  histogram.pack( ) // pack histogram
    c.  encodingSize := histogram.getAverageEncodingSize( )
    d.  IF encodingSize < bestEncodingSize
        a.  best#OffsetBits= #offsetBits
        b.  bestEncodingSize= encodingSize
    e.  ENDIF
    4.  ENDFOR
    5.  END
```

The algorithm loops over the different number of offset bits, and builds the histograms accordingly. The optimal bucket width is determined by comparing the average encoding size of different histograms. The simple algorithm can be improved in several aspects: first, since the bucket width does not affects the encoding efficiency for values counted as items, one only needs to compute the average encoding size for values counted as buckets and noise instead of that of the whole histogram; second, a larger step size of the loop over #offsetBits can be applied for data types like strings.

In case it is not allowed to offload the most infrequent noises to be counted as noises, the influence of the bucket width on encoding efficiency is deterministic and is solely bounded by the size of dictionary for prefix bits. The above algorithm can be simplified with a search that gradually decreases the bucket width from the maximal possible, and stops when the number of required buckets exceeds a pre-configured maximum. Another similar situation is when the noises are stored in uncompressed format.

The sampling approach constructs a full histogram (occurrences of each distinct value) of a set of sample data, and then the optimal bucket width is calculated by applying the above mentioned algorithm to the full histogram. The selection of sample data can be arbitrary, including but not limited to random sampling. It is also possible to do special handling to the data stream, so that a first batch contains the sample data. In this case, there is no difference between using sampling and using a first batch of data. Otherwise, the calculation of bucket width from sample data is considered as a pre-processing step, and the sample data will be discarded after the bucket width calculation.

After determining the bucket width for the initial data batch or by sampling the same bucket width (offset length) is used for all/subsequent batches to allow efficient merging. The details of merging two multi-granularity histograms are discussed next with reference to FIG. 5.

The counts of a current data batch are merged to the counts of already processed data batches (see FIG. 5): items with items, buckets with buckets, and noise with noise (if there is any). For items with the same value, and for buckets with the same prefix bits, their counts are added up.

The limits M and N on the maximal number of items and buckets need to be applied to the merged multi-granularity histogram, which may require repacking the multi-granularity histogram, i.e. re-sorting the items and buckets of the merged multi-granularity histogram and move the least frequent items that are exceeding the limit M to buckets, and the removing of excessive buckets (more than N) to be counted as noise (when enabled).

However, if the repacking is preformed after each merge, a bias may be introduced on values that appear later. In fact, in the common cases where the data is not time-skewed, most of the frequent values of each batch should be more or less the same, and thus the merged multi-granularity histogram is not much larger than the original ones. In such usual cases, it is preferable to perform one repacking at the end, i.e. after the multi-granularity histograms of all data batches are merged. Accordingly, it is possible to exclude those items that are included in the occurrence count information because those items are occasionally frequent in only one or few of the buckets.

When the data to be encoded is time dependent and many different data values appear in each new data batch, the size of the multi-granularity histogram might grow too fast. In the rare worst case, a linear growth of the number of items (M*batches) and bucket (N*batches) may occur. In order to deal with such cases as well, it is possible to have a balanced solution that enforces another upper bound on the number of items and buckets in the merged histogram (say, x*M and x*N), and perform repack whenever they are exceeded.

When no noise is allowed, it is possible that the merged multi-granularity histogram contains more than N buckets. In such cases, it is necessary to adjust (increment) the length of offset bits S and reorganize the buckets until the number of buckets does not exceed N. The reorganize process is essentially the same as determining the optimal bucket width as described above, except that the method is applied on buckets instead of individual values.

The multi-granularity histogram described above contains three (two if no noise is allowed) levels of granularity for occurrence counting. It is possible to have more granularity levels by allowing multiple levels of bucket, with ascending number of maximal buckets and bucket widths for each level.

As was mentioned before, the items, buckets, and noise constitute three different levels of granularity for occurrence counting, from finest to coarsest. It is possible to add further levels of granularity with additional layers of buckets of different bucket widths. The bucket widths should be arranged so that finer granularity layers, i.e. smaller bucket widths, should be placed higher up in the hierarchy, which means nearer to the individual value occurrence counts. In general, the higher layers should contain values that are more frequent than the lower layers. Practically, the formation of multiple layers of buckets can be done recursively, with a process similar to the formation of buckets from items. As an example, consider a histogram with two layers of buckets L1 with finer granularity and L2 with coarser granularity. The construction of histogram starts with the individual value counts, and following the same process as described above, the values are separated into frequent items, and infrequent ones that are counted in the buckets, at this time with L1 buckets. When reducing the L1 buckets to its maximal size, the excessive buckets that are less frequent are counted in L2 buckets at a coarser granularity, which also means larger capacity. This applies when the width of buckets are predefined for all levels of buckets. The automatic determination of optimal widths for multiple levels of buckets can also be determined by comparing the entropy of different alternatives, despite that a simple brut-force algorithm with nested loops over multiple layers may suffer from poor performance due to too many possible combinations. This can however be solved by applying many well-known algorithms or heuristics for optimization issues that works faster.

Figure 6:
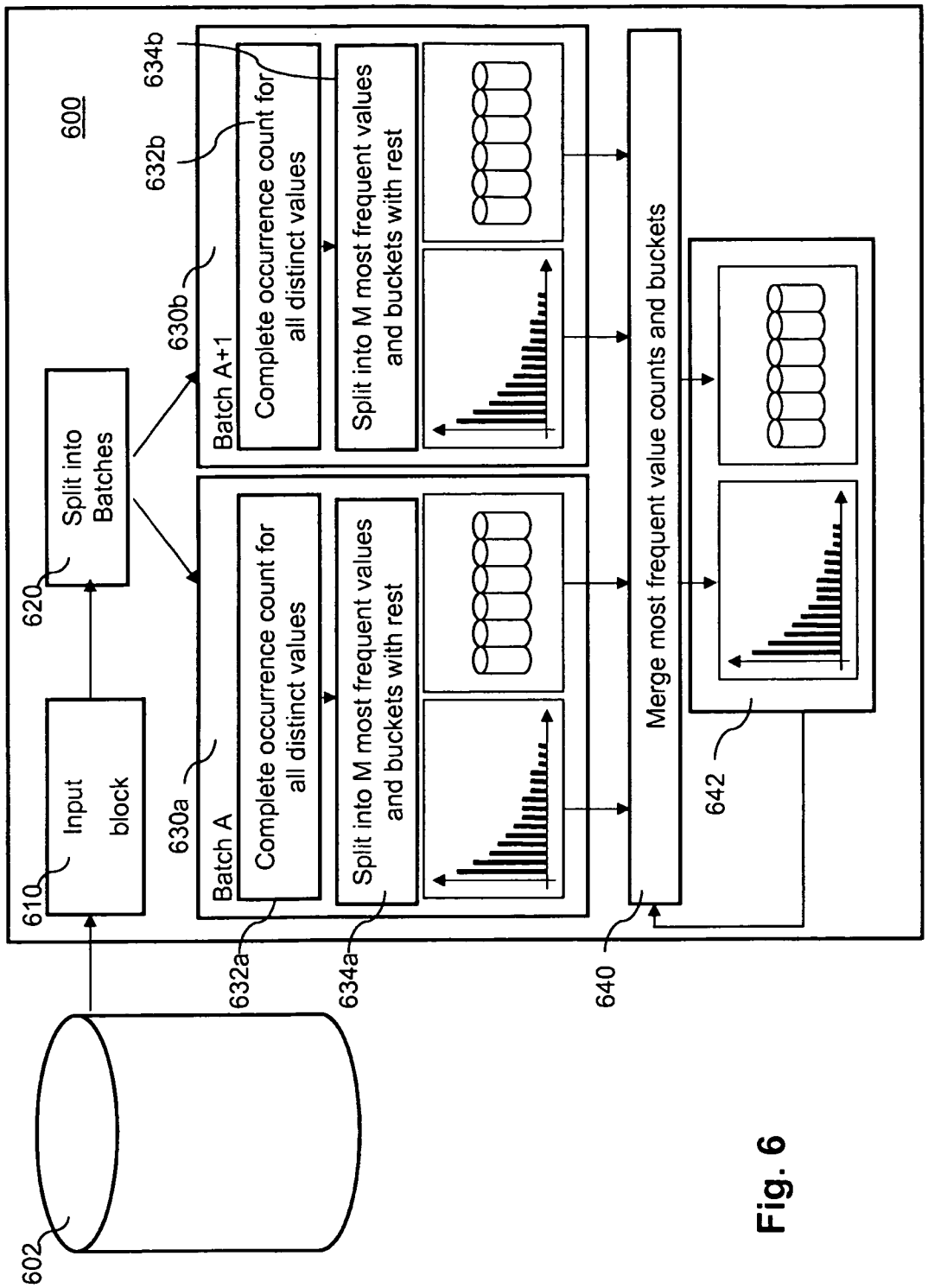
FIG. 6 shows, as an example of a system where the present invention may be implemented, a schematic block diagram of a data processing system.

FIG. 6 shows, as an example of a system where the present invention may be implemented, a schematic block diagram of a data processing system 600. The data processing system 600 is receiving data to be encoded from a data source 602 via its input block 610. The data source 602 may be, for example, a disk or a database.

The data processing system 600 has a limited amount of memory available for storing and processing occurrence count information of the data to be encoded. The received data stream is split into batches in the splitting block 620. The data processing system 600 is shown to have, as an example, two batch histogram blocks 630a, 630b for enabling parallel processing. The batch histogram blocks may reside on various computing units or there may be only a single batch histogram block present in the data processing system 600.

The batch histogram blocks provide the functionality 632a, 632b for determining occurrences of data values in a data batch, and the functionality 634a, 634b to determine occurrence count information for at most a first number (M) of most frequent data values in the data batch and to generate for rest of the data values in the data batch a histogram having a second number (N) of buckets.

The data processing system 600 is shown to have one merging block 640, which is operably connected to the batch histogram blocks 630a, 630b. It is possible that also the merging functionality is provided in a distributed manner by a number of computing units of the data processing system 600. The merging block 640 provides the functionality for merging two instances of the occurrence count information together and for merging two instances of histograms together. The final output from the merging block 640 is a multi-granularity histogram 642 reflecting the whole data set to be encoded.

Figure 7:
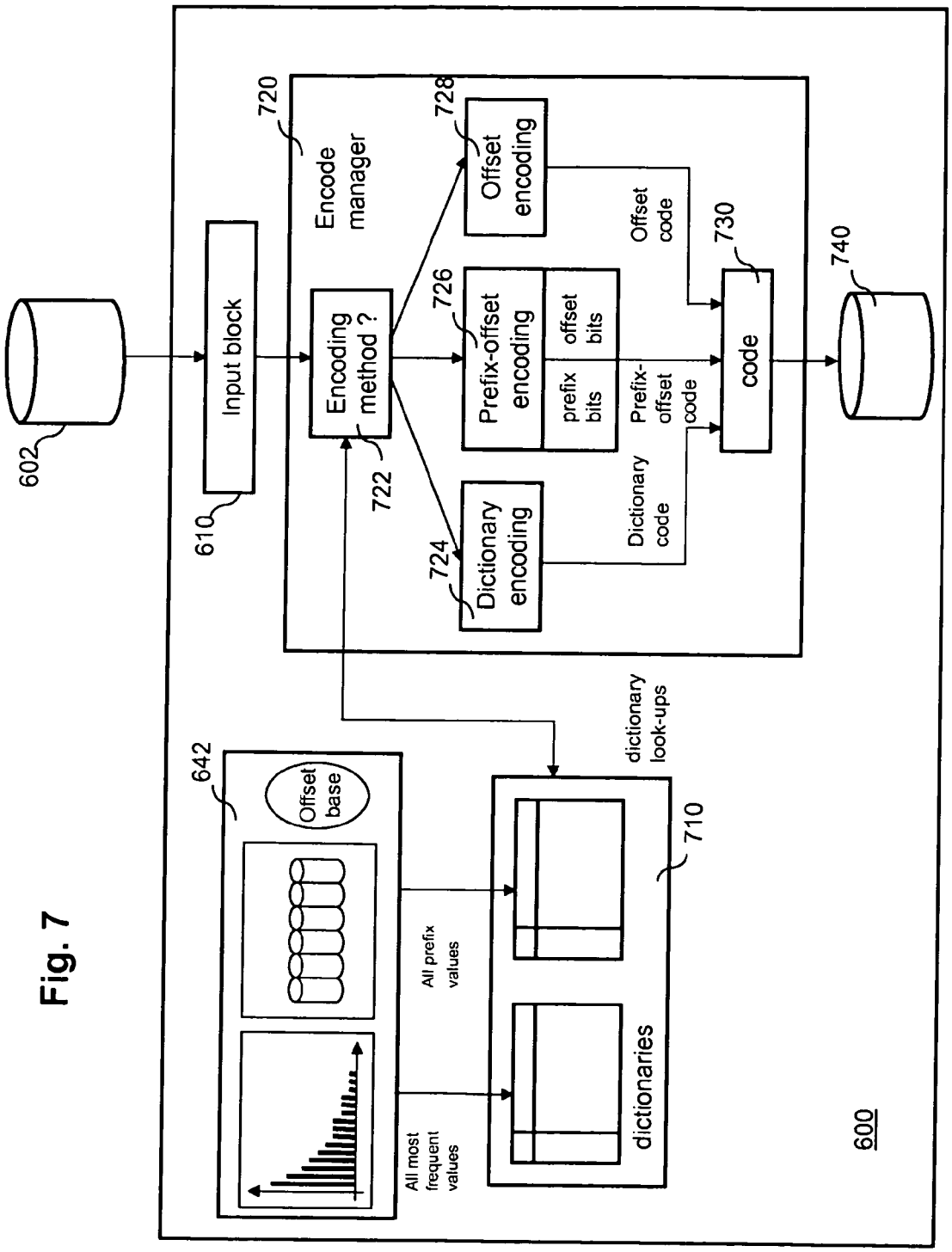
FIG. 7 shows some further details of a data processing system, especially about how the multi-granularity histogram is used for encoding data.

FIG. 7 shows some further details of the data processing system 600, especially about how the multi-granularity histogram 642 is used for encoding data. As a preparation for the encoding of the data, the multi-granularity histogram 642 is used as input of dictionary building. For each frequent individual value and for each prefix bits, a dictionary entry is created using any suitable dictionary encoding method. FIG. 7 shows separate dictionaries 710 for the most frequent values and for the prefix values, but a simplified configuration with one collective dictionary for both the values and prefix bits works as well. The derived dictionary or dictionaries 710 are then used for the encoding and decoding of values. The right side of FIG. 7 presents a block diagram of data encoding using the multi-granularity histogram 642 and the dictionary 710 derived from it. The data to be compressed is feed into the input block 610, either streaming in from an outside data source 602 for a second time, or from a local data storage where the data was stored during the feed of data during histogram building. The input block 610 forwards each individual value to the encoding block 720, which contains and manages sub-components for encoding. The encode manager first tries to determine in block 722 if the current value can be dictionary encoded by looking up the value in dictionary 710. If the value is found, the value will be encoded with the found dictionary code in block 724. Otherwise, the encode manager 720 will test the applicability of prefix-offset encoding by dividing the prefix and offset bits, according to the number of offset bits used in the histogram 642, and then tries to lookup the prefix bits in dictionary 710. A successful lookup will result into prefix code, which will be concatenated with the offset bits by the prefix-offset encoding component 726. Otherwise, the offset encoding component 728 will be invoked, if a common base value for offset coding has been defined in the histogram 642. The encoded data values (codes) 730 may be kept in memory (especially in in-memory databases) or stored in persistent storage means 740.

Decoding of data follows a similar system architecture, but the whole process and the functionality of components should be reversed.

The data processing system 600 may be a database, for example, an in-memory database. As a further example, the data processing system 600 may be a data warehousing system. As an even further example, the data processing system 600 may be a system storing (typically huge amounts of) measurement data from measurement instruments.

Other examples are all data processing systems that need to efficiently store or transfer huge amounts of (semi-) structured data. Some examples for such data processing systems are backup, content management and archiving solutions, which may be based on file systems instead of databases. Also in the context of distributed systems, one could employ this invention in a communication system to reduce the amount of data to be transferred over the wire. Another possible use is to extract subsets of data from big databases, compress the data using the technique described here and store it on a mobile device for personal use (without necessarily using a database to access the data).

The system in FIG. 6 is given as an example of a computing and/or storage system, where the present invention is applicable. It is appreciate that the present invention may be applicable in any computing or storage system, where occurrence information of data to be compressed or encoded is needed.

Embodiments of the present invention are suitable for counting occurrences of values from high volume data with very large cardinality using multi-granularity histograms, which preserves occurrence probability information as much as possible under given memory constraints, and allows applying hybrid compression methods to achieve better compression efficiency. Embodiments of the invention manage to solve the conflicting requirement of categorizing all values into frequent ones, less frequent ones, and most infrequent ones without having a complete occurrence count of values.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described above with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

In the appended claims a computerized method refers to a method whose steps are performed by a computing system containing a suitable combination of one or more processors, memory means and storage means.

While the foregoing has been with reference to particular embodiments of the invention, it will be appreciated by those skilled in the art that changes in these embodiments may be made without departing from the principles and spirit of the invention, the scope of which is defined by the appended claims.

What is claimed is:

1. A computerized method for generating occurrence data of data values for enabling encoding of a data set, said method comprising
    determining occurrences of data values in a first data batch;
    determining occurrence count information for at most a first number of most frequent data values in the first data batch, said occurrence count information identifying said most frequent data values and their occurrence counts, wherein the first number of most frequent data values is less than a number of data values in the first data batch;
    generating for the data values in the first data batch that are not included in the most frequent data values at least a first histogram having a second number of buckets;
    merging said occurrence count information of the first data batch to merged occurrence count information of a second data batch;
    merging said first histogram of the first data batch to a merged histogram corresponding to the second data batch;
    processing a next data batch as a first data batch until the data set to be encoded is processed in batches.

2. The method according to claim 1, further comprising determining encoding scheme for the data set based at least on the merged occurrence count information corresponding to the data set and the merged histogram corresponding to the data set.

3. The method according to claim 1, further comprising determining the width of the buckets for said at least first histogram when processing the first data batch.

4. The method according to claim 3, wherein prefix-offset coding is used for encoding the values in histogram buckets and the width of the buckets equals the number of offset bits, the size of the prefix-offset code being the sum of a number of offset bits and the size of said prefix code, said method comprising determining the number of offset bits by minimizing the size of the prefix-offset code under the constraint of a given maximal size for prefix code dictionary for the first data batch.

5. The method according to claim 1, further comprising sampling said set of data for determining width of the buckets.

6. The method according to claim 1, further comprising repacking the merged occurrence count information and the merged histogram by carrying out at least one of the following steps:
    moving at least one of the most frequent data values associated with the merged occurrence count information to the merged histogram;
    adjusting the width of buckets in the merged histogram if the number of buckets in the merged histogram is more than the second number; and
    removing at least one bucket of the merged histogram and counting values associated with said at least one bucket as noise.

7. The method according to claim 1, further comprising
    providing a first predefined threshold for the number of data values for which occurrence counts are tracked with the merged occurrence count information and a second predefined threshold for the number of buckets in the merged histogram, and
    repacking the merged occurrence counts and the merged histogram into at most the first number of frequent data values and a histogram having the second number of buckets in response to at least one of the first predefined threshold and the second predefined threshold being exceeded.

8. The method according to claim 1, further comprising
    using dictionary encoding for values associated with the merged occurrence count information; and
    using prefix-offset coding for values associated with the at least first histogram.

9. The method according to claim 1, further comprising
    maintaining most infrequent values separate from the at least first histogram and the merged histogram; and
    storing said most infrequent values using at least one of the following formats: uncompressed format, offset encoding.

10. The method according to claim 1, further comprising using a hierarchy of histograms, wherein the bucket width of a histogram associated with more frequent values is smaller than the bucket width of histogram associated with less frequent values.

11. A data processing system, comprising
    input means for receiving data to be encoded;
    splitting means for splitting data to be encoded into data batches;
    batch histogram means for determining occurrences of data values in a data batch, said batch histogram means adapted to:
        determine occurrence count information for at most a first number of most frequent data values in the data batch, said occurrence count information identifying said most frequent data values and their occurrence counts, wherein the first number of most frequent data values is less than a number of data values in the first data batch;

generate for the data values in the data batch that are not included in the most frequent data values at least a first histogram having a second number of buckets;

merging means, operably connected to said batch histogram means, for merging said occurrence count information of a first data batch to merged occurrence count information of at least one further data batch and for merging said first histogram of a first data batch to a merged histogram corresponding to said at least one further data batch.

12. The data processing system of claim 11, further comprising encoding scheme means for determining encoding scheme for the data set based at least on the merged occurrence count information corresponding to the data set and the merged histogram corresponding to the data set.

13. The data processing system of claim 12, further comprising encoding means for encoding said data according to the encoding scheme.

14. The data processing system of claim 11, comprising a number of computing units and said batch histogram means are provided in a distributed manner in said computing units.

15. A computer program product comprising a computer-usable medium and a computer readable program, wherein the computer readable program when executed on a data processing system causes the data processing system to carry out a method comprising:

determining occurrences of data values in a first data batch;

determining occurrence count information for at most a first number of most frequent data values in the first data batch, said occurrence count information identifying said most frequent data values and their occurrence counts, wherein the first number of most frequent data values is less than a number of data values in the first data batch;

generating for the data values in the first data batch that are not included in the most frequent data values at least a first histogram having a second number of buckets;

merging said occurrence count information of the first data batch to merged occurrence count information of a second data batch;

merging said first histogram of the first data batch to a merged histogram corresponding to the second data batch;

processing a next data batch as a first data batch until the data set to be encoded is processed in batches.

16. The computer program product according to claim 15, further comprising determining encoding scheme for the data set based at least on the merged occurrence count information corresponding to the data set and the merged histogram corresponding to the data set.

17. The computer program product according to claim 15, further comprising determining the width of the buckets for said at least first histogram when processing the first data batch.

18. The computer program product according to claim 15, further comprising providing a first predefined threshold for the number of data values for which occurrence counts are tracked with the merged occurrence count information and a second predefined threshold for the number of buckets in the merged histogram, and repacking the merged occurrence counts and the merged histogram into at most the first number of frequent data values and a histogram having the second number of buckets in response to at least one of the first predefined threshold and the second predefined threshold being exceeded.

19. The computer program product according to claim 15, further comprising using dictionary encoding for values associated with the merged occurrence count information; and using prefix-offset coding for values associated with the at least first histogram.

20. The computer program product according to claim 15, further comprising maintaining most infrequent values separate from the at least first histogram and the merged histogram; and storing said most infrequent values using at least one of the following formats: uncompressed format, offset encoding.

* * * * *